United States Patent
Kojo

(10) Patent No.: US 10,600,953 B2
(45) Date of Patent: Mar. 24, 2020

(54) PIEZOELECTRIC RESONATOR DEVICE

(71) Applicant: Daishinku Corporation, Kakogawa-shi, Hyogo (JP)

(72) Inventor: Takuya Kojo, Kakogawa (JP)

(73) Assignee: DAISHINKU CORPORATION, Kakogawa (JP)

( * ) Notice: Subject to any disclaimer, the term of this patent is extended or adjusted under 35 U.S.C. 154(b) by 116 days.

(21) Appl. No.: 15/765,498

(22) PCT Filed: Oct. 31, 2016

(86) PCT No.: PCT/JP2016/082234
§ 371 (c)(1),
(2) Date: Apr. 3, 2018

(87) PCT Pub. No.: WO2017/077972
PCT Pub. Date: May 11, 2017

(65) Prior Publication Data
US 2019/0074427 A1 Mar. 7, 2019

(30) Foreign Application Priority Data

Nov. 6, 2015 (JP) .................................. 2015-218297

(51) Int. Cl.
*H01L 41/047* (2006.01)
*H03H 9/05* (2006.01)
(Continued)

(52) U.S. Cl.
CPC .............. *H01L 41/18* (2013.01); *H01L 23/02* (2013.01); *H01L 23/04* (2013.01); *H01L 41/047* (2013.01);
(Continued)

(58) Field of Classification Search
CPC ...... H03H 6/0595; H03H 9/17; H01L 41/047; H01L 41/053
See application file for complete search history.

(56) References Cited

U.S. PATENT DOCUMENTS

2013/0193807 A1  8/2013  Mizusawa

FOREIGN PATENT DOCUMENTS

JP     08-340231 A     12/1996
JP     2005-295115 A   10/2005
(Continued)

*Primary Examiner* — J. San Martin

(57) ABSTRACT

A crystal resonator (101) includes: a crystal resonator plate (2); a first sealing member (3); a second sealing member (4); and an internal space (13) hermetically sealing a vibrating part (22) of the crystal resonator plate (2). The crystal resonator plate (2) includes: the vibrating part (22); an external frame part (23) surrounding an outer periphery of the vibrating part (22); and a connecting part (24) connecting the vibrating part (22) to the external frame part (23). A first extraction electrode (223) drawn from a first excitation electrode (221) is formed on a first main surface of the connecting part (24) while a second extraction electrode (224) drawn from a second excitation electrode (222) is formed on a second main surface thereof. A wiring pattern (33) connected to the first extraction electrode (223) is formed on a second main surface (312) of the first sealing member (3). At least part of the wiring pattern (33) is disposed to be superimposed to a space between the vibrating part (22) and the external frame part (23) in plan view.

6 Claims, 11 Drawing Sheets

(51) Int. Cl.
    *H01L 41/18*     (2006.01)
    *H01L 23/02*     (2006.01)
    *H01L 23/04*     (2006.01)
    *H03H 9/13*     (2006.01)
    *H03H 9/10*     (2006.01)
    *H01L 41/053*     (2006.01)
    *H03B 5/32*     (2006.01)

(52) U.S. Cl.
    CPC ............ *H01L 41/053* (2013.01); *H03B 5/32* (2013.01); *H03H 9/0595* (2013.01); *H03H 9/1035* (2013.01); *H03H 9/13* (2013.01)

(56) References Cited

FOREIGN PATENT DOCUMENTS

| | | | |
|---|---|---|---|
| JP | 2010-252051 A | | 11/2010 |
| JP | 2012074807 A | * | 4/2012 |
| JP | 2012-195976 A | | 10/2012 |
| JP | 2013-055632 A | | 3/2013 |
| JP | 2013-157831 A | | 8/2013 |
| JP | 2015-076771 A | | 4/2015 |

* cited by examiner

PIEZOELECTRIC RESONATOR DEVICE

TECHNICAL FIELD

The present invention relates to piezoelectric resonator devices.

BACKGROUND ART

Recent years, in various electronic devices, their operating frequencies have increased and their packages (especially, their height) have been downsized. According to such an increase in operating frequency and a reduction in package size, there is also a need for piezoelectric resonator devices (crystal oscillators, for example) to be adaptable to the increase in operating frequency and the reduction in package size.

In this kind of piezoelectric resonator devices, a housing is constituted by a substantially rectangular-shaped package. The package is constituted by: a first sealing member and a second sealing member both made of glass or crystal; and a crystal resonator plate made of crystal. On respective main surfaces of the crystal resonator plate, excitation electrodes are formed. The first sealing member and the second sealing member are laminated and bonded via the crystal resonator plate. Thus, the excitation electrodes of the crystal resonator plate that is disposed in the package (in the internal space) are hermetically sealed (for example, see Patent Document 1). Hereinafter, such a laminated structure of the piezoelectric resonator device is referred to as a sandwich structure.

PRIOR ART DOCUMENT

Patent Document

[Patent Document 1] JP 2010-252051 A

SUMMARY OF THE INVENTION

Problem to Be Solved by the Invention

As mentioned above, recently, the piezoelectric resonator devices have been downsized. Meanwhile, when a wiring pattern (metallic pattern) that is connected to a vibrating part (excitation electrode) of a piezoelectric resonator plate is formed on each main surface of the piezoelectric resonator plate, the wiring pattern should be disposed on the external periphery of the vibrating part of the piezoelectric resonator plate. In this case, it is necessary to reduce the size of the vibrating part or to increase the package size of the piezoelectric resonator device in order to ensure a region on the piezoelectric resonator plate for disposing the wiring pattern. Therefore, it is difficult to downsize the piezoelectric resonator device without reducing the size of the vibrating part.

The present invention was made in consideration of the above circumstances, an object of which is to provide a piezoelectric resonator device having a sandwich structure that can be downsized while ensuring the size of a vibrating part.

Means for Solving the Problem

In order to solve the above-described problem, the present invention has a configuration specified below. That is, in the present invention, a piezoelectric resonator device includes: a piezoelectric resonator plate including a first excitation electrode formed on a first main surface of a substrate, and a second excitation electrode formed on a second main surface of the substrate, the second excitation electrode making a pair with the first excitation electrode; a first sealing member covering the first excitation electrode of the piezoelectric resonator plate; a second sealing member covering the second excitation electrode of the piezoelectric resonator plate; and an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate. The piezoelectric resonator plate further includes: the vibrating part formed so as to have a substantially rectangular shape; an external frame part surrounding an outer periphery of the vibrating part; and a connecting part connecting the vibrating part to the external frame part. The vibrating part, the connecting part and the external frame part are formed integrally with one another. A first extraction electrode, which is drawn from the first excitation electrode, is formed on a first main surface of the connecting part while a second extraction electrode, which is drawn from the second excitation electrode, is formed on a second main surface of the connecting part. A wiring that is connected to the first extraction electrode is formed on a surface of the first sealing member facing the piezoelectric resonator plate. At least part of the wiring is disposed so as to be superimposed to a space between the vibrating part and the external frame part in plan view.

With the above-described configuration, it is possible to effectively use the surface of the first sealing member facing the piezoelectric resonator plate as a region in which the wiring that is connected to the first extraction electrode (the first excitation electrode) is disposed, which leads to downsizing of the piezoelectric resonator device while maintaining the size of the vibrating part. In other words, it is not necessary to separately prepare, on the piezoelectric resonator plate, the region in which the wiring is disposed, which allows increase in the size of the vibrating part. As a result, it is not necessary to reduce the size of the vibrating part too much in order to meet the requirement to reduce the size of the piezoelectric resonator device.

Also, it is possible to reduce the region as the sum of the arrangement area of the vibrating part and the wiring in plan view compared to the configuration in which the wiring that is connected to the first extraction electrode (the first excitation electrode) is provided on the outer periphery (the external frame part) of the vibrating part of the piezoelectric resonator plate. Therefore, it is possible to downsize the piezoelectric resonator device without reducing the size of the vibrating part. Furthermore, since it is possible to prevent reduction of the region for bonding the external frame part of the piezoelectric resonator plate to the respective sealing members, the bonding region can be ensured so as to realize more stable sealing hermeticity. In addition, it is possible to prevent the wiring and the vibrating part from making contact with each other. Thus, it is possible to reduce disconnection, or increase in the resistance value, of the wiring caused by the contact of the wiring with the vibrating part.

In the piezoelectric resonator device having the configuration as described above, the wiring may be disposed so as to completely cover the space along one side of the vibrating part in plan view.

With the above-described configuration, the piezoelectric resonator device can be easily designed to reduce the wiring resistance by thickening the wiring width. Thus, it is possible to ensure the reliability of the piezoelectric resonator device by reducing the wiring resistance.

In the piezoelectric resonator device having the configuration as described above, it is preferable that the wiring has a film thickness of not less than 0.05 μm.

With the above-described configuration, the wiring resistance can be set to a value that can ensure the reliability of the piezoelectric resonator device by setting the film thickness of the wiring to not less than 0.05 μm.

In the piezoelectric resonator device having the configuration as described above, the wiring may be disposed outside a region irradiated with ion beams for adjusting the frequency of the first excitation electrode and the second excitation electrode in plan view.

With the above-described configuration, since the wiring is disposed outside the region irradiated with the ion beams, it is possible to prevent the wiring from being disconnected by the ion beams.

In the piezoelectric resonator device having the configuration as described above, the wiring may be disposed so as to not be superimposed to the first excitation electrode and the second excitation electrode in plan view.

With the above-described configuration, since the wiring is disposed so as to not be superimposed to the first excitation electrode and the second excitation electrode, it is possible to reduce generation of parasitic capacity (stray capacity) due to the wiring that is superimposed to the first excitation electrode and the second excitation electrode.

In the piezoelectric resonator device having the configuration as described above, the surface of the first sealing member facing the piezoelectric resonator plate may be formed as a flat surface.

With the above-described configuration, since the surface of the first sealing member facing the piezoelectric resonator plate is formed as a flat surface, the thickness of the first sealing member can be prevented from increasing compared to the case in which a recess part is disposed in the above surface. Thus, it is possible to contribute to reduction in height of the piezoelectric resonator device. Furthermore, since the steps of processing the recess part can be skipped, it is more suitable for reduction in cost.

In the piezoelectric resonator device having the configuration as described above, the connecting part may extend from only one corner part of the vibrating part to the external frame part.

With the above-described configuration, since the connecting part is disposed on the corner part where displacement of the piezoelectric vibration is relatively small in the outer periphery edge part of the vibrating part, it is possible to prevent leakage of the piezoelectric vibration to the external frame part via the connecting part compared to the case in which the connecting part is provided on the position other than the corner part (i.e. central part of the respective sides), which makes the vibrating part piezoelectrically vibrate more effectively. Furthermore, compared to the configuration in which two or more connecting parts are disposed, it is possible to reduce a stress applied to the vibrating part, which results in reduction in frequency shift of the piezoelectric vibration due to the stress. Thus, stability of the piezoelectric vibration can be improved.

Effects of the Invention

With the piezoelectric resonator device of the present invention, it is possible to effectively use the surface of the first sealing member facing the piezoelectric resonator plate as a region in which the wiring that is connected to the first extraction electrode (the first excitation electrode) is disposed, which leads to downsizing of the piezoelectric resonator device while maintaining the size of the vibrating part. In other words, it is not necessary to separately prepare, on the piezoelectric resonator plate, the region in which the wiring is disposed, which allows increase in the size of the vibrating part. As a result, it is not necessary to reduce the size of the vibrating part too much in order to meet the requirement to reduce the size of the piezoelectric resonator device.

MEANS FOR CARRYING OUT THE INVENTION

Embodiment 1

Hereinafter, an embodiment of the present invention will be described with reference to the drawings. In the following embodiment, the present invention is applied to a crystal resonator as a piezoelectric resonator device.

Figure 1:
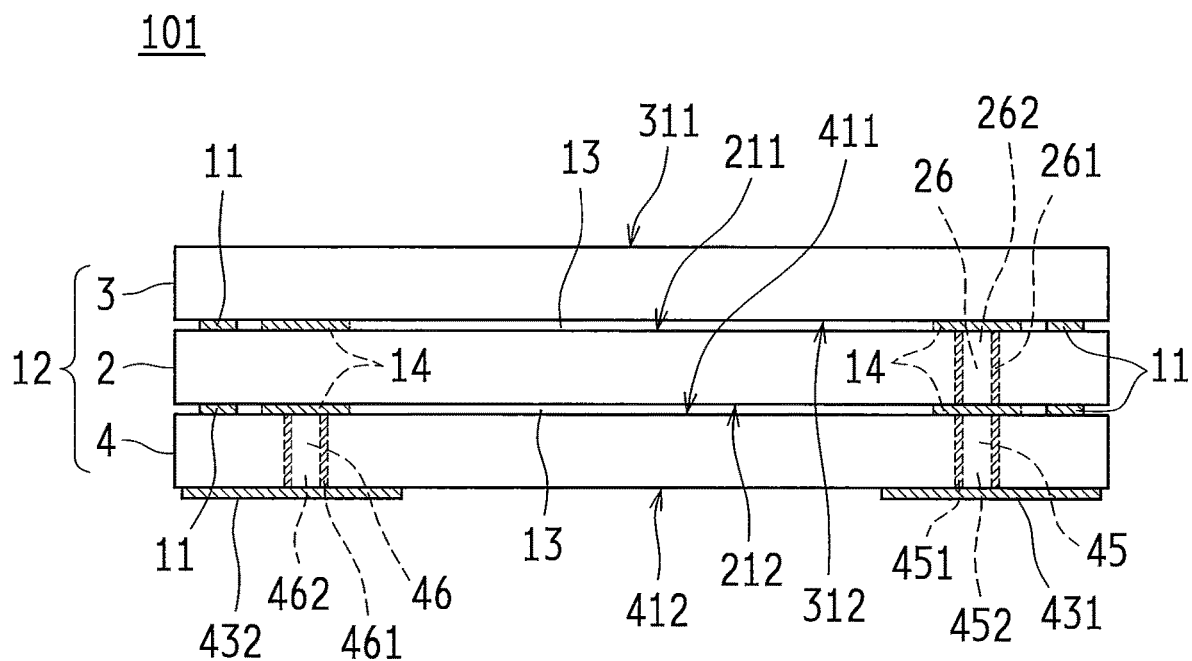
FIG. 1 is a schematic configuration diagram illustrating a configuration of a crystal resonator according to an embodiment.

As shown in FIG. 1, a crystal resonator 101 according to this embodiment includes: a crystal resonator plate 2 (a piezoelectric resonator plate in the present invention); a first sealing member 3 that covers a first excitation electrode 221 (see FIG. 4) of the crystal resonator plate 2 so as to hermetically seal the first excitation electrode 221 that is formed on a first main surface 211 of the crystal resonator plate 2; and a second sealing member 4 disposed on a side of a second main surface 212 of the crystal resonator plate 2 so as to cover a second excitation electrode 222 (see FIG. 5) of the crystal resonator plate 2, the second sealing member 4 hermetically sealing the second excitation electrode 222 that makes a pair with the first excitation electrode 221. In the crystal resonator 101, the crystal resonator plate 2 is bonded to the first sealing member 3, and also the crystal resonator plate 2 is bonded to the second sealing member 4. Thus, a package 12 having a sandwich structure is constituted.

An internal space 13 of the package 12 is formed by bonding the first sealing member 3 to the second sealing member 4 via the crystal resonator plate 2. In this internal space 13 of the package 12, a vibrating part 22 is hermetically sealed. The vibrating part 22 includes the first excitation electrode 221 and the second excitation electrode 222 respectively formed on both main surfaces 211 and 212 of the crystal resonator plate 2. The crystal resonator 101 according to this embodiment has, for example, a package size of 1.0×0.8 mm, which is reduced in size and height. According to the size reduction, no castellation is formed in the package 12. Through holes (first to third through holes) are used for conduction between electrodes.

Next, the configuration of the above-described crystal resonator 101 will be described referring to FIGS. 1 to 7. Here, each of the crystal resonator plate 2, the first sealing member 3 and the second sealing member 4 will be described as a single body without being bonded.

Figure 4:
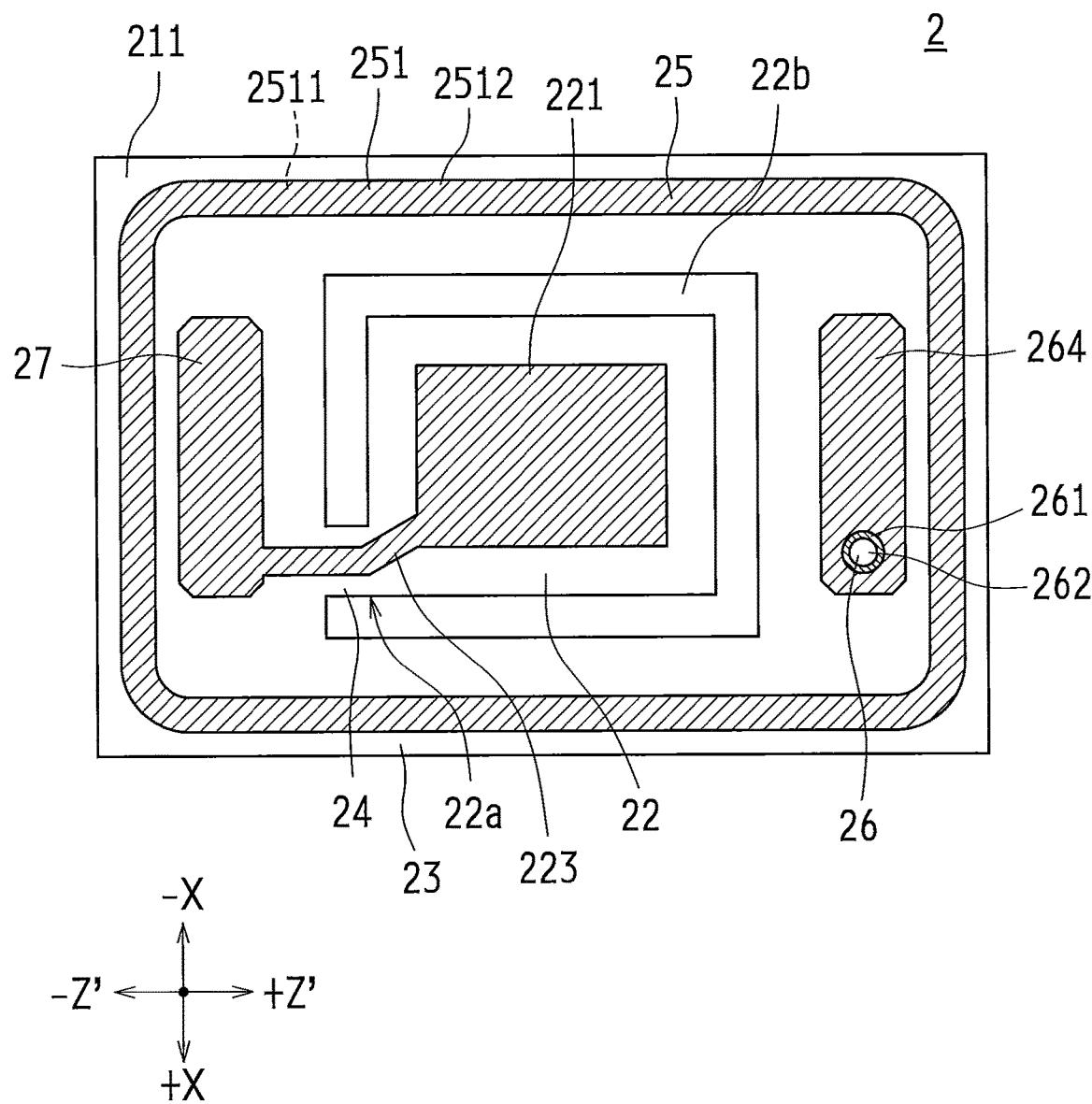
FIG. 4 is a schematic plan view illustrating a crystal resonator plate of the crystal resonator.
Figure 5:
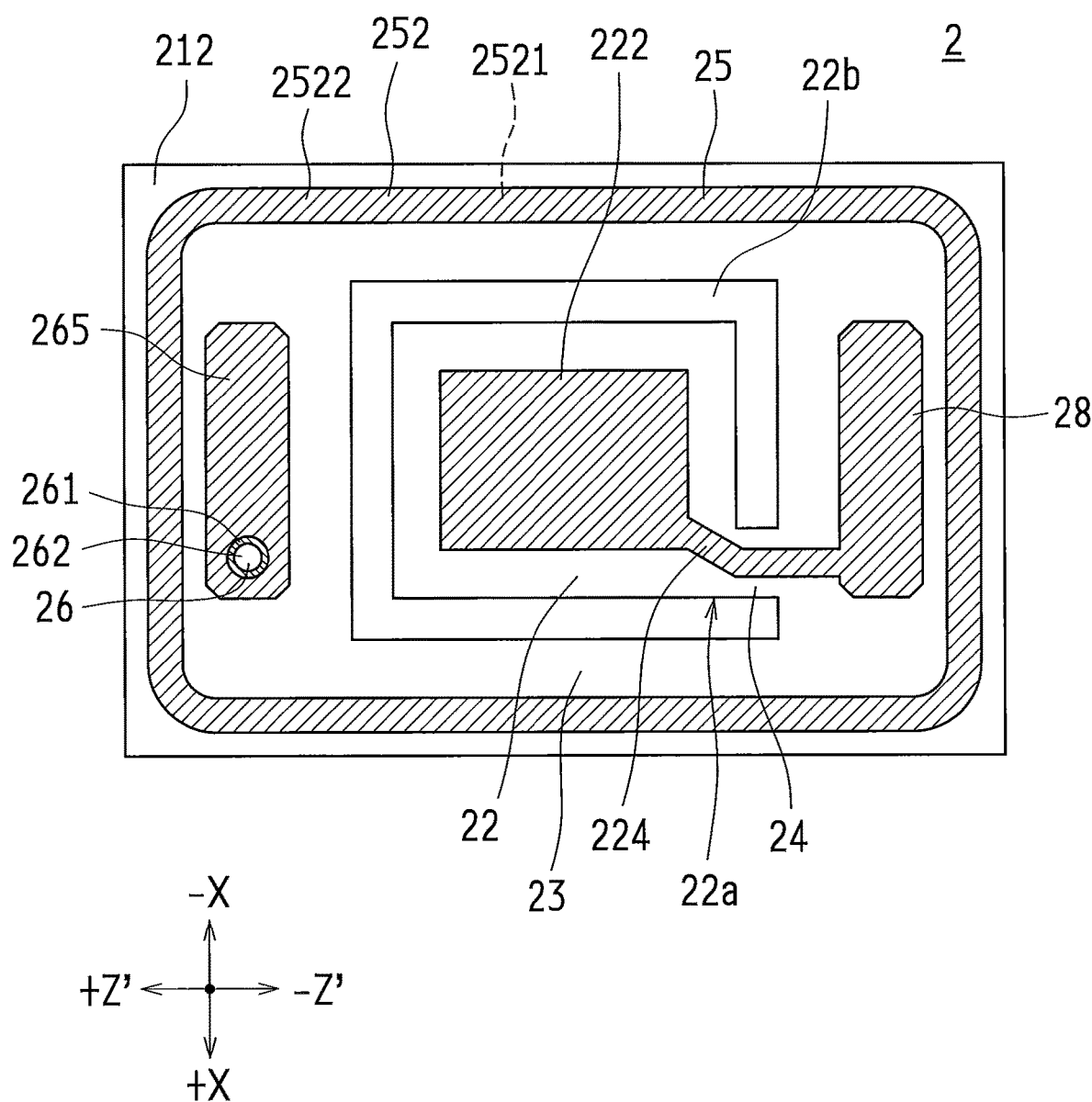
FIG. 5 is a schematic rear view illustrating the crystal resonator plate of the crystal resonator.

As shown in FIGS. 4 and 5, the crystal resonator plate 2 is made of a crystal as a piezoelectric material. Both main surfaces (the first main surface 211 and the second main surface 212) are formed as smooth flat surfaces (mirror-finished). In this embodiment, an AT-cut crystal resonator plate that causes thickness shear vibration is used as the crystal resonator plate 2. In the crystal resonator plate 2 shown in FIGS. 4 and 5, both main surfaces 211 and 212 of the crystal resonator plate 2 are an XZ' plane. On this XZ' plane, a direction in parallel with the lateral direction (short side direction) of the crystal resonator plate 2 is the X axis direction, and a direction in parallel with the longitudinal direction (long side direction) of the crystal resonator plate 2 is the Z' axis direction. The AT-cut method is a processing method in which a crystal plate is cut out of synthetic quartz crystal at an angle tilted by 35° 15' about an X axis from a Z axis, out of the three crystal axes (i.e. an electrical axis (X axis), a mechanical axis (Y axis) and an optical axis (Z axis)) of the synthetic quartz crystal. The X axis of the AT-cut crystal plate equals the crystal axis of the crystal. The Y' axis and the Z' axis equal the respective axes that tilt by 35° 15' from the Y axis and the Z axis out of the crystal axes of the crystal. The Y' axis direction and the Z' axis direction correspond to the direction in which the AT-cut crystal is cut out.

A pair of excitation electrodes (i.e. the first excitation electrode 221 and the second excitation electrode 222) is formed, respectively, on the main surfaces 211 and 212 of the crystal resonator plate 2. The crystal resonator plate 2 includes: the vibrating part 22 formed so as to have a substantially rectangular shape; an external frame part 23 surrounding the outer periphery of the vibrating part 22; and a connecting (holding) part 24 that connects the vibrating part 22 to the external frame part 23. The vibrating part 22, the connecting part 24 and the external frame part 23 are integrally formed. In this embodiment, the connecting part 24 is provided at only one position between the vibrating part 22 and the external frame part 23, and the remaining part between the vibrating part 22 and the external frame part 23 on which the connecting part 24 is not provided is made as a space (clearance). Although it is not shown in the drawings, the vibrating part 22 and the connecting part 24 are formed so as to have the thickness thinner than the external frame part 23. Due to the difference in the thickness between the external frame part 23 and the connecting part 24, the natural frequency of piezoelectric vibration differs between the external frame part 23 and the connecting part 24. Thus, the external frame part 23 is not likely to resonate with the piezoelectric vibration of the connecting part 24.

The connecting part 24 extends (protrudes) from only one corner part 22a positioned in the +X direction and in the -Z' direction of the vibrating part 22 to the external frame part 23 in the -Z' direction. Thus, since the connecting part 24 is disposed on the corner part 22a where displacement of the piezoelectric vibration is relatively small in the outer periphery edge part of the vibrating part 22, it is possible to prevent leakage of the piezoelectric vibration to the external frame part 23 via the connecting part 24 compared to the case in which the connecting part 24 is provided on the position other than the corner part 22a (i.e. central part of the respective sides), which makes the vibrating part 22 piezoelectrically vibrate more effectively. Furthermore, compared to the configuration in which two or more connecting parts 24 are disposed, it is possible to reduce a stress applied to the vibrating part 22, which results in reduction in frequency shift of the piezoelectric vibration due to the stress. Thus, stability of the piezoelectric vibration can be improved.

The first excitation electrode 221 is provided on the first main surface of the vibrating part 22 while the second excitation electrode 222 is provided on the second main surface of the vibrating part 22. Extraction electrodes (a first extraction electrode 223 and a second extraction electrode 224), which are connected to external electrode terminals (a first external electrode terminal 431 and a second external electrode terminal 432), are respectively connected to the first excitation electrode 221 and the second excitation electrode 222. The first extraction electrode 223 is drawn from the first excitation electrode 221 and connected to a connecting bonding pattern 27 formed on the external frame part 23 via the connecting part 24. The second extraction electrode 224 is drawn from the second excitation electrode 222 and connected to a connecting bonding pattern 28 formed on the external frame part 23 via the connecting part 24. Accordingly, the first extraction electrode 223 is formed on the first main surface of the connecting part 24, and the second extraction electrode 224 is formed on the second main surface of the connecting part 24. The first excitation electrode 221 and the first extraction electrode 223 are constituted by a base PVD film deposited on the first main surface 211 by physical vapor deposition, and an electrode PVD film deposited on the base PVD film by the physical vapor deposition. The second excitation electrode 222 and the second extraction electrode 224 are constituted by a base PVD film deposited on the second main surface 212 by the physical vapor deposition, and an electrode PVD film deposited on the base PVD film by the physical vapor deposition.

Resonator-plate-side sealing parts 25 for bonding the crystal resonator plate 2 respectively to the first sealing member 3 and the second sealing member 4 are provided on the respective main surfaces 211 and 212 of the crystal resonator plate 2. On the resonator-plate-side sealing part 25 on the first main surface 211 of the crystal resonator plate 2, a resonator-plate-side first bonding pattern 251 is formed to be bonded to the first sealing member 3. Also, on the resonator-plate-side sealing part 25 on the second main surface 212 of the crystal resonator plate 2, a resonator-plate-side second bonding pattern 252 is formed to be bonded to the second sealing member 4. The resonator-plate-side first bonding pattern 251 and the resonator-plate-side second bonding pattern 252 are each formed on the external frame part 23 so as to have an annular shape in plan view. The resonator-plate-side first bonding pattern 251 and the resonator-plate-side second bonding pattern 252 are disposed on the respective main surfaces 211 and 212 of the crystal resonator plate 2 so as to be close to the outer peripheral edge of the main surfaces 211 and 212. The pair of first excitation electrode 221 and second excitation electrode 222 of the crystal resonator plate 2 is not electrically connected to the resonator-plate-side first bonding pattern 251 and the resonator-plate-side second bonding pattern 252.

The resonator-plate-side first bonding pattern 251 is constituted by a base PVD film 2511 deposited on the first main surface 211 by the physical vapor deposition, and an electrode PVD film 2512 deposited on the base PVD film 2511 by the physical vapor deposition. The resonator-plate-side second bonding pattern 252 is constituted by a base PVD film 2521 deposited on the second main surface 212 by the physical vapor deposition, and an electrode PVD film 2522 deposited on the base PVD film 2521 by the physical vapor deposition. That is, the resonator-plate-side first bonding pattern 251 and the resonator-plate-side second bonding pattern 252 have the same configuration in which a plurality of layers is laminated on the resonator-plate-side sealing part 25 of each main surface 211 and 212, specifically, a Ti layer (or a Cr layer) and an Au layer are deposited by vapor deposition in this order from the lowermost layer side. Like this, in the resonator-plate-side first bonding pattern 251 and the resonator-plate-side second bonding pattern 252, the base PVD films 2511 and 2521 are made of a single material (Ti or Cr), the electrode PVD films 2512 and 2522 are made of a single material (Au), and the electrode PVD films 2512 and 2522 have a thickness greater than the thickness of the base PVD films 2511 and 2521. The first excitation electrode 221 and the resonator-plate-side first bonding pattern 251 both formed on the first main surface 211 of the crystal resonator plate 2 have the same thickness, and the surfaces of the first excitation electrode 221 and the resonator-plate-side first bonding pattern 251 are made of the same metal. The second excitation electrode 222 and the resonator-plate-side second bonding pattern 252 both formed on the second main surface 212 of the crystal resonator plate 2 have the same thickness, and the surfaces of the second excitation electrode 222 and the resonator-plate-side second bonding pattern 252 are made of the same metal. The resonator-plate-side first bonding pattern 251 and the resonator-plate-side second bonding pattern 252 do not contain Sn.

Here, the first excitation electrode 221, the first extraction electrode 223 and the resonator-plate-side first bonding pattern 251 can have the same configuration. In this case, it is possible to form collectively the first excitation electrode 221, the first extraction electrode 223 and the resonator-plate-side first bonding pattern 251 in the same process. Similarly to the above, the second excitation electrode 222, the second extraction electrode 224 and the resonator-plate-side second bonding pattern 252 can have the same configuration. In this case, it is possible to form collectively the second excitation electrode 222, the second extraction electrode 224 and the resonator-plate-side second bonding pattern 252 in the same process. More specifically, the base PVD films and the electrode PVD films are formed using a PVD method (for example, a film forming method for patterning in processing such as photolithography) such as vacuum deposition, sputtering, ion plating, molecular beam epitaxy (MBE) and laser ablation. Thus, it is possible to form the films collectively, which leads to reduction in producing processes and in cost.

Also, as shown in FIGS. 4 and 5, a through hole (first through hole 26) is formed in the crystal resonator plate 2 so as to penetrate between the first main surface 211 and the second main surface 212. The first through hole 26 is disposed in the external frame part 23 of the crystal resonator plate 2. The first through hole 26 is connected to a connecting bonding pattern 453 of the second sealing member 4.

In the first through hole 26, a through electrode 261 is formed along an inner wall surface of the first through hole 26 so as to establish conduction between electrodes formed on the first main surface 211 and the second main surface 212, as shown in FIGS. 1, 4 and 5. A central part of the first through hole 26 is a hollow through part 262 penetrating between the first main surface 211 and the second main surface 212. Connecting bonding patterns 264 and 265 are formed on respective outer peripheries of the first through hole 26. The connecting bonding patterns 264 and 265 are formed respectively on the main surfaces 211 and 212 of the crystal resonator plate 2.

The connecting bonding pattern 264 of the first through hole 26 formed on the first main surface 211 of the crystal resonator plate 2 extends on the external frame part 23 in the X axis direction. The connecting bonding pattern 27 is formed on the first main surface 211 of the crystal resonator plate 2 so as to be connected to the first extraction electrode 223. The connecting bonding pattern 27 also extends on the external frame part 23 in the X axis direction. The connecting bonding pattern 27 is formed on the side opposite to the connecting bonding pattern 264 in the Z' axis direction with the vibrating part 22 (the first excitation electrode 221) being interposed therebetween. That is, the connecting bonding patterns 27 and 264 are formed respectively on both sides of the vibrating part 22 in the Z' axis direction.

Similarly to the above, the connecting bonding pattern 265 of the first through hole 26 formed on the second main surface 212 of the crystal resonator plate 2 extends on the external frame part 23 in the X axis direction. The connecting bonding pattern 28 is formed on the second main surface 212 of the crystal resonator plate 2 so as to be connected to the second extraction electrode 224. The connecting bonding pattern 28 also extends on the external frame part 23 in the X axis direction. The connecting bonding pattern 28 is formed on the side opposite to the connecting bonding pattern 265 in the Z' axis direction with the vibrating part 22 (the second excitation electrode 222) being interposed therebetween. That is, the connecting bonding patterns 28 and 265 are formed respectively on both sides of the vibrating part 22 in the Z' axis direction.

The connecting bonding patterns 27, 28, 264 and 265 have the same configuration as the resonator-plate-side first bonding pattern 251 and the resonator-plate-side second bonding pattern 252, accordingly, they can be formed by the same process as that for the resonator-plate-side first bonding pattern 251 and the resonator-plate-side second bonding pattern 252. Specifically, each connecting bonding pattern 27, 28, 264 and 265 is constituted by a base PVD film deposited on each main surface (the first main surface 211 and the second main surface 212) of the crystal resonator plate 2 by the physical vapor deposition, and an electrode PVD film deposited on the base PVD film by the physical vapor deposition.

In the crystal resonator 101, the first through hole 26 and the connecting bonding patterns 27, 28, 264 and 265 are formed in the inward position of the internal space 13 (inside of respective inner peripheral surfaces of bonding materials 11) in plan view. The internal space 13 is formed in the inward position (inside) of the resonator-plate-side first bonding pattern 251 and the resonator-plate-side second bonding pattern 252 in plan view. Here, the inward position of the internal space 13 means strictly the inner side of the respective inner peripheral surfaces of the bonding materials 11 (described later), not including the positions on the bonding materials 11. The first through hole 26 and the connecting bonding patterns 27, 28, 264 and 265 are not electrically connected to the resonator-plate-side first bonding pattern 251 and the resonator-plate-side second bonding pattern 252.

Figure 2:
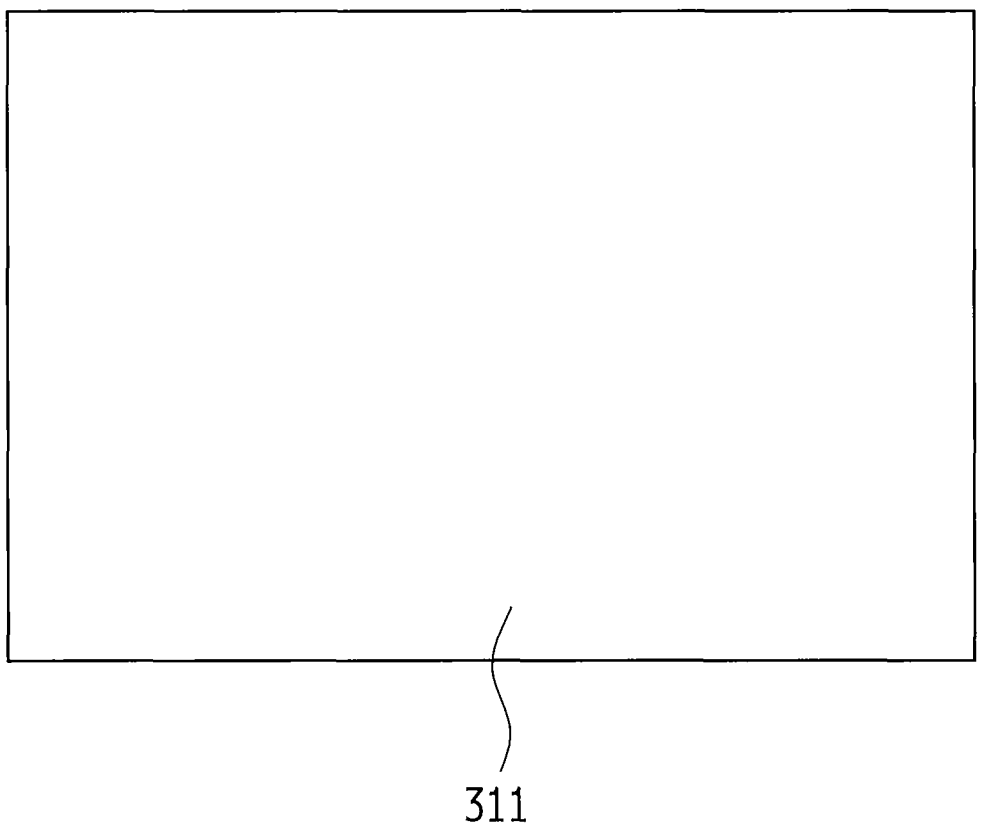
FIG. 2 is a schematic plan view illustrating a first sealing member of the crystal resonator.
Figure 3:
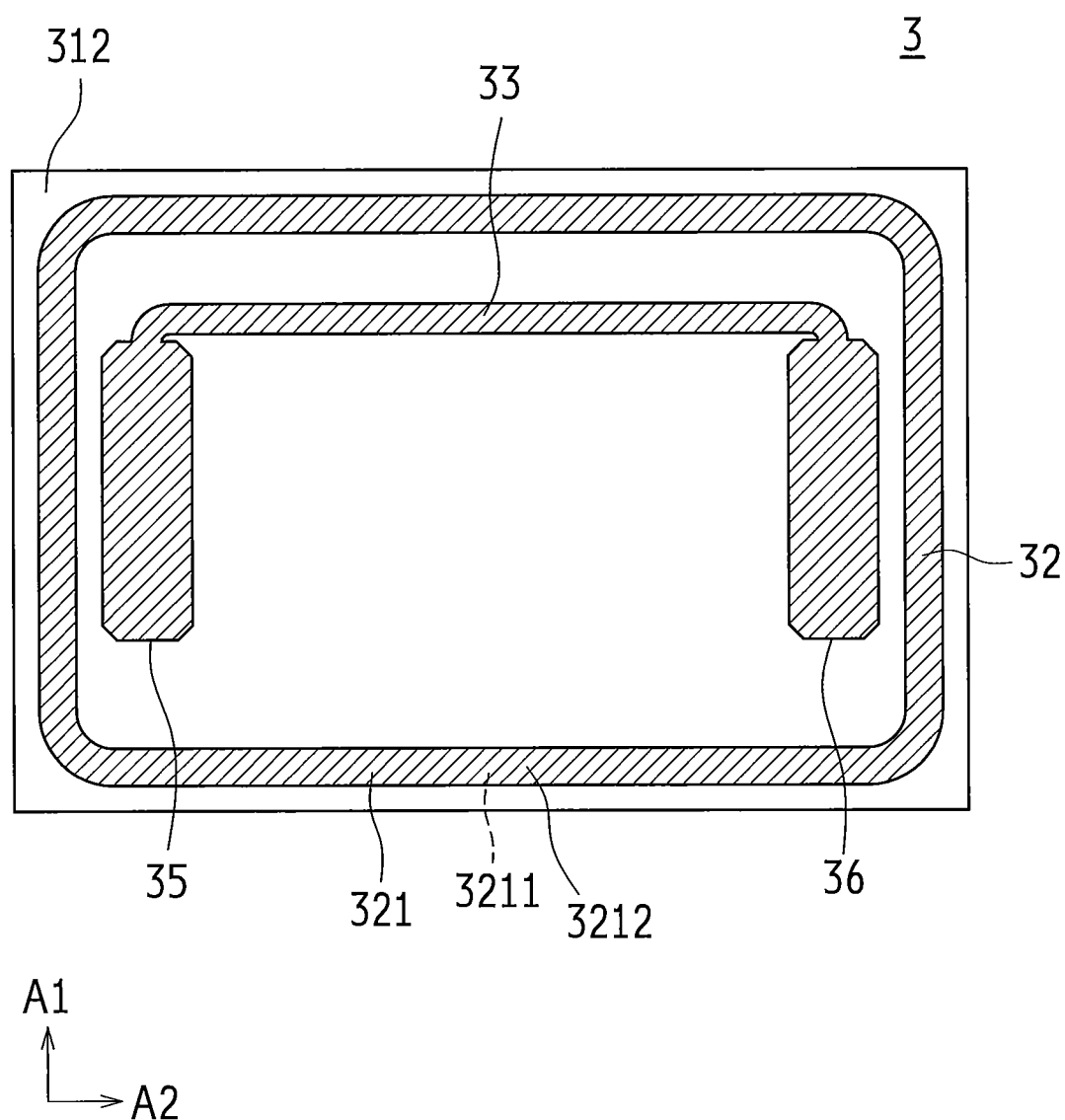
FIG. 3 is a schematic rear view illustrating the first sealing member of the crystal resonator.

The first sealing member 3 is made of a material having the flexural rigidity (moment of inertia of area×Young's modulus) of not more than 1000 [N·mm$^2$]. Specifically, as shown in FIGS. 2 and 3, the first sealing member 3 is a substrate having a rectangular parallelepiped shape that is made of a single glass wafer. A second main surface 312 (a surface to be bonded to the crystal resonator plate 2) of the first sealing member 3 is formed as a smooth flat surface (mirror finished).

On the second main surface 312 of the first sealing member 3, a sealing-member-side first sealing part 32 is disposed so as to be bonded to the crystal resonator plate 2. A sealing-member-side first bonding pattern 321 is formed on the sealing-member side first sealing part 32 so as to be bonded to the crystal resonator plate 2. The sealing-member-side first bonding pattern 321 is formed so as to have an annular shape in plan view. The sealing-member-side first bonding pattern 321 is disposed so as to be close to the outer peripheral edge of the second main surface 312 of the first sealing member 3. The sealing-member-side first bonding pattern 321 has the same width at all positions on the sealing-member-side first sealing part 32 of the first sealing member 3.

The sealing-member-side first bonding pattern 321 is constituted by a base PVD film 3211 deposited on the first sealing member 3 by the physical vapor deposition, and an electrode PVD film 3212 deposited on the base PVD film 3211 by the physical vapor deposition. In this embodiment, the base PVD film 3211 is made of Ti (or Cr), and the electrode PVD film 3212 is made of Au. Also, the sealing-member-side first bonding pattern 321 does not contain Sn. Specifically, the sealing-member-side first bonding pattern 321 is made of a plurality of layers laminated on the sealing-member-side first sealing part 32 of the second main surface 312, that is, a Ti layer (or a Cr layer) and an Au layer are deposited by the vapor deposition in this order from the lowermost layer side.

On the second main surface 312 (i.e. the surface facing the crystal resonator plate 2) of the sealing member 3, connecting bonding patterns 35 and 36 are formed so as to be bonded, respectively, to the connecting bonding patterns 264 and 27 of the crystal resonator plate 2. The connecting bonding patterns 35 and 36 extend in the short side direction (in the A1 direction in FIG. 3) of the first sealing member 3. The connecting bonding patterns 35 and 36 are provided at a predetermined interval in the long side direction (in the A2 direction in FIG. 3) of the first sealing member 3. The interval between the connecting bonding patterns 35 and 36 in the A2 direction is substantially the same as the interval between the connecting bonding patterns 264 and 27 in the Z' direction of the crystal resonator plate 2 (see FIG. 4). The connecting bonding patterns 35 and 36 are connected to each other via a wiring pattern 33. The wiring pattern 33 is disposed between the connecting bonding patterns 35 and 36. The wiring pattern 33 extends in the A2 direction. The wiring pattern 33 is not bonded to the connecting bonding patterns 264 and 27 of the crystal resonator plate 2.

The connecting bonding patterns 35 and 36, and the wiring pattern 33 have the same configuration as the sealing-member-side first bonding pattern 321, accordingly, they can be formed by the same process as that for the sealing-member-side first bonding pattern 321. Specifically, each of the connecting bonding patterns 35 and 36 and the wiring pattern 33 is constituted by a base PVD film deposited on the second main surface 312 of the first sealing member 3 by the physical vapor deposition, and an electrode PVD film deposited on the base PVD film by the physical vapor deposition.

In the crystal resonator 101, the connecting bonding patterns 35 and 36, and the wiring pattern 33 are formed in the inward position of the internal space 13 (inside of the respective inner peripheral surfaces of the bonding materials 11) in plan view. The connecting bonding patterns 35 and 36, and the wiring pattern 33 are not electrically connected to the sealing-member-side first bonding pattern 321. In the crystal resonator 101, the A1 direction in FIG. 3 equals the X axis direction in FIG. 4, and the A2 direction in FIG. 3 equals the Z' axis direction in FIG. 4.

Figure 6:
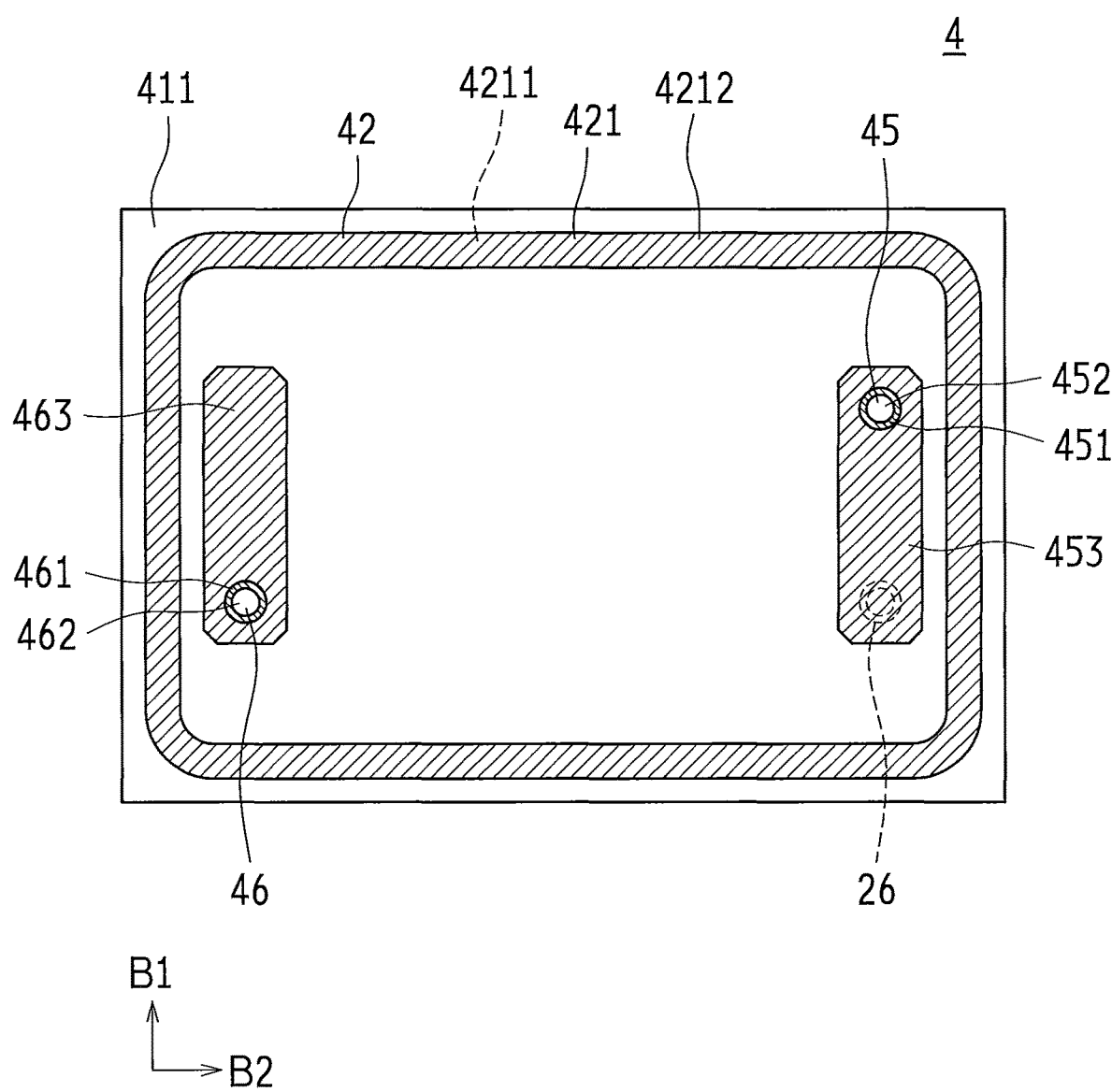
FIG. 6 is a schematic plan view illustrating a second sealing member of the crystal resonator.
Figure 7:
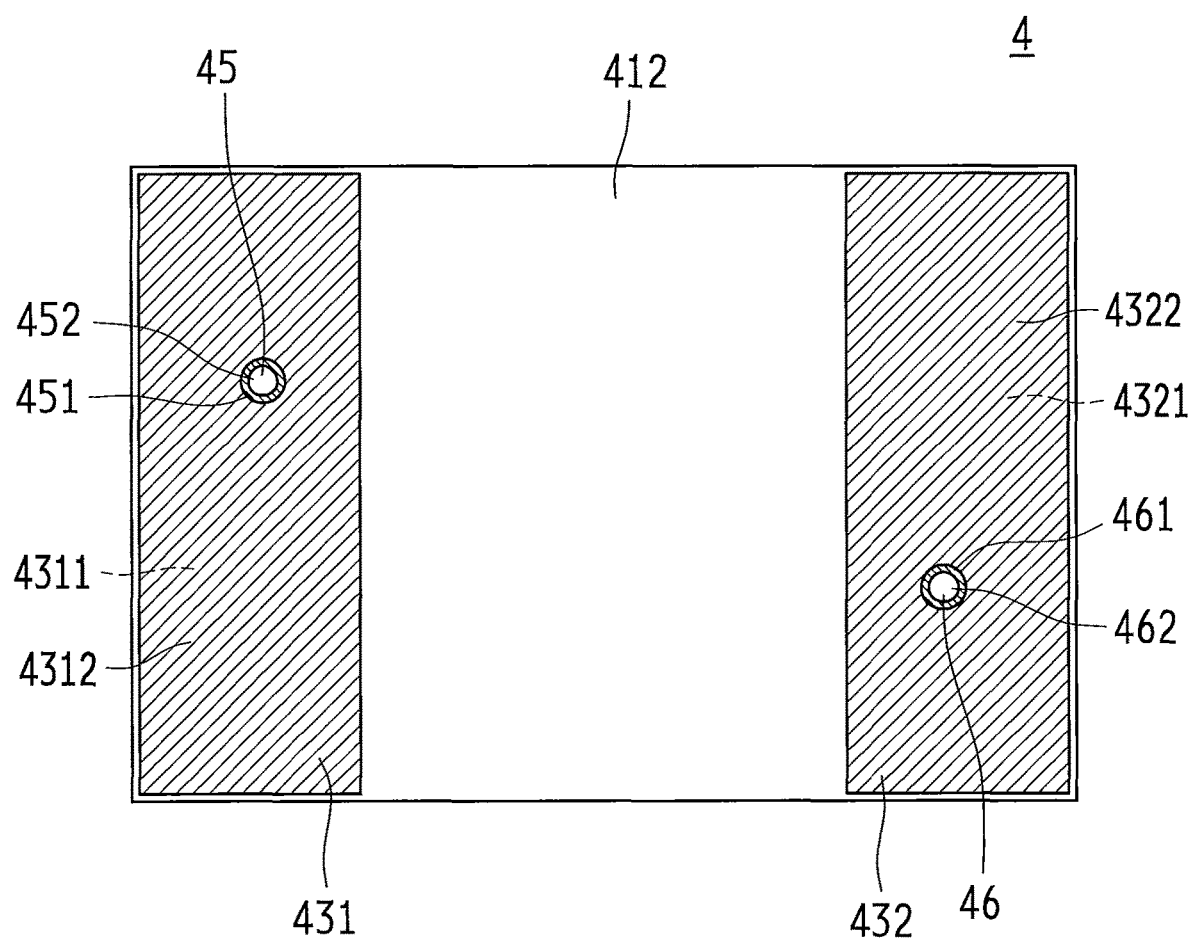
FIG. 7 is a schematic rear view illustrating the second sealing member of the crystal resonator.

The second sealing member 4 is made of a material having the flexural rigidity (moment of inertia of area× Young's modulus) of not more than 1000 [N·mm$^2$]. Specifically, as shown in FIGS. 6 and 7, the second sealing member 4 is a substrate having a rectangular parallelepiped shape that is made of a single glass wafer. A first main surface 411 (a surface to be bonded to the crystal resonator plate 2) of the second sealing member 4 is formed as a smooth flat surface (mirror finished).

On the first main surface 411 of the second sealing member 4, a sealing-member-side second sealing part 42 is disposed so as to be bonded to the crystal resonator plate 2. On the sealing-member-side second sealing part 42, a sealing-member-side second bonding pattern 421 is formed so as to be bonded to the crystal resonator plate 2. The sealing-member-side second bonding pattern 421 is formed so as to have an annular shape in plan view. The sealing-member-side second bonding pattern 421 is disposed so as to be close to the outer peripheral edge of the first main surface 411 of the second sealing member 4. The sealing-member-side second bonding pattern 421 has the same width at all positions on the sealing-member-side second sealing part 42 of the second sealing member 4.

The sealing-member-side second bonding pattern 421 is constituted by a base PVD film 4211 deposited on the second sealing member 4 by the physical vapor deposition, and an electrode PVD film 4212 deposited on the base PVD film 4211 by the physical vapor deposition. In this embodiment, the base PVD film 4211 is made of Ti (or Cr), and the electrode PVD film 4212 is made of Au. Also, the sealing-member-side second bonding pattern 421 does not contain Sn. Specifically, the sealing-member-side second bonding pattern 421 is made of a plurality of layers laminated on the sealing-member-side second sealing part 42 of the second main surface 412, that is, a Ti layer (or a Cr layer) and an Au layer are deposited by the vapor deposition in this order from the lowermost layer side.

Also, a pair of external electrode terminals (the first external electrode terminal 431 and the second external electrode terminal 432), which is electrically connected to the outside, is formed on a second main surface 412 (the outer main surface not facing the crystal resonator plate 2) of the second sealing member 4. As shown in FIGS. 1 and 7, the first external electrode terminal 431 and the second external electrode terminal 432 are located at respective end parts of the second main surface 412 of the second sealing member 4 in the longitudinal direction in plan view. The pair of external electrode terminals (the first external electrode terminal 431 and the second external electrode terminal 432)

is constituted by base PVD films 4311 and 4321 deposited on the second main surface 412 by the physical vapor deposition, and electrode PVD films 4312 and 4322 respectively deposited on the base PVD films 4311 and 4321 by the physical vapor deposition. The first external electrode terminal 431 and the second external electrode terminal 432 each cover a region of not less than ⅓ of the area of the second main surface 412 of the second sealing member 4.

As shown in FIGS. 1, 6 and 7, two through holes (a second through hole 45 and a third through hole 46) are formed in the second sealing member 4 so as to penetrate between the first main surface 411 and the second main surface 412. The second through hole 45 is connected to the first external electrode terminal 431 and to the connecting bonding pattern 265 of the crystal resonator plate 2. The third through hole 46 is connected to the second external electrode terminal 432 and to the connecting bonding pattern 28 of the crystal resonator plate 2.

In the second through hole 45 and the third through hole 46, through electrodes 451 and 461 are respectively formed along inner wall surfaces of the second through hole 45 and the third through hole 46 so as to establish conduction between electrodes formed on the first main surface 411 and the second main surface 412, as shown in FIGS. 1, 6 and 7. Respective central parts of the second through hole 45 and the third through hole 46 are hollow through parts 452 and 462 penetrating between the first main surface 411 and the second main surface 412. Connecting bonding patterns 453 and 463 are formed respectively on the outer peripheries of the second through hole 45 and the third through hole 46.

The connecting bonding patterns 453 and 463 are provided on the first main surface 411 of the second sealing member 4 so as to be bonded, respectively, to the connecting bonding patterns 265 and 28 of the crystal resonator plate 2. The connecting bonding patterns 453 and 463 extend in the short side direction (in the B1 direction in FIG. 6) of the second sealing member 4. The connecting bonding patterns 453 and 463 are provided at a predetermined interval in the long side direction (in the B2 direction in FIG. 6) of the second sealing member 4. The interval between the connecting bonding patterns 453 and 463 in the B2 direction is substantially the same as the interval between the connecting bonding patterns 265 and 28 in the Z' axis direction of the crystal resonator plate 2 (see FIG. 5).

The connecting bonding patterns 453 and 463 have the same configuration as the sealing-member-side second bonding pattern 421, accordingly, they can be formed by the same process as that for the sealing-member-side second bonding pattern 421. Specifically, each of the connecting bonding patterns 453 and 463 is constituted by a base PVD film deposited on the first main surface 411 of the second sealing member 4 by the physical vapor deposition, and an electrode PVD film deposited on the base PVD film by the physical vapor deposition.

In the crystal resonator 101, the second through hole 45, the third through hole 46, and the connecting bonding patterns 453 and 463 are formed in the inward position of the internal space 13 in plan view. The second through hole 45, the third through hole 46, and the connecting bonding patterns 453 and 463 are not electrically connected to the sealing-member-side second bonding pattern 421. Also, the first external electrode terminal 431 and the second external electrode terminal 432 are not electrically connected to the sealing-member-side second bonding pattern 421. In the crystal resonator 101, the B1 direction in FIG. 6 equals the X axis direction in FIG. 5, and the B2 direction in FIG. 6 equals the Z' axis direction in FIG. 5.

In the crystal resonator 101 having the above configuration, the crystal resonator plate 2 and the first sealing member 3 are subjected to diffusion bonding in a state in which the resonator-plate-side first bonding pattern 251 and the sealing-member-side first bonding pattern 321 are overlapped with each other, and the crystal resonator plate 2 and the second sealing member 4 are subjected to the diffusion bonding in a state in which the resonator-plate-side second bonding pattern 252 and the sealing-member-side second bonding pattern 421 are overlapped with each other, thus, the package 12 having the sandwich structure as shown in FIG. 1 is produced. In contrast to the conventional art, no special bonding material, such as an adhesive, is needed separately. Thus, the internal space 13 of the package 12, i.e. the space for housing the vibrating part 22 is hermetically sealed. The resonator-plate-side first bonding pattern 251 and the sealing-member-side first bonding pattern 321 themselves serve as the bonding material 11 formed upon the diffusion bonding. The resonator-plate-side second bonding pattern 252 and the sealing-member-side second bonding pattern 421 themselves serve as the bonding material 11 formed upon the diffusion bonding. The respective bonding materials 11 are formed so as to have an annular shape in plan view. In this embodiment, all the wirings from the first and the second excitation electrodes 221 and 222 of the crystal resonator plate 2 to the first external electrode terminal 431 and the second external electrode terminal 432 are formed inside the bonding materials 11 in plan view. The bonding materials 11 are formed so as to be close to the outer peripheral edge of the package 12 in plan view. In this way, it is possible to increase the size of the vibrating part 22 of the crystal resonator plate 2.

At this time, the respective connecting bonding patterns as described above are also subjected to the diffusion bonding in a state in which they are overlapped with each other. Specifically, the connecting bonding pattern 264 of the crystal resonator plate 2 and the connecting bonding pattern 35 of the first sealing member 3 are subjected to the diffusion bonding. The connecting bonding pattern 27 of the crystal resonator plate 2 and the connecting bonding pattern 36 of the first sealing member 3 are subjected to the diffusion bonding. The connecting bonding pattern 265 of the crystal resonator plate 2 and the connecting bonding pattern 453 of the second sealing member 4 are subjected to the diffusion bonding. The connecting bonding pattern 28 of the crystal resonator plate 2 and the connecting bonding pattern 463 of the second sealing member 4 are subjected to the diffusion bonding. Then, the respective pairs of the connecting bonding patterns become the bonding materials 14 formed upon the diffusion bonding. The bonding materials 14 formed upon the diffusion bonding serve to establish conduction between the through electrodes of the through holes and the bonding materials 14, and to hermetically seal the bonding parts. Since the bonding materials 14 are formed inside the bonding materials 11 for sealing in plan view, they are shown by the broken line in FIG. 1.

Here, the first through hole 26 and the second through hole 45 are disposed so as to not be superimposed to each other in plan view.

Specifically, as shown in FIG. 6, the first through hole 26 and the second through hole 45 are vertically linearly arranged in front view (i.e. when viewed from the B1 direction in FIG. 6). For convenience sake, in FIG. 6, the first through hole 26 formed in the crystal resonator plate 2 disposed above the second sealing member 4 is shown by the dashed double-dotted line. On the other hand, the first through hole 26 and the second through hole 45 are offset from each other so as to not be vertically linearly arranged in side view (i.e. when viewed from the B2 direction in FIG. 6). More specifically, the first through hole 26 is connected to one end part of the bonding material 14 (the connecting bonding patterns 265 and 453) in the longitudinal direction thereof (in the B1 direction), and the second through hole 45 is connected to the other end part of the bonding material 14 in the longitudinal direction thereof. Thus, the through electrode 261 of the first through hole 26 is electrically connected to the through electrode 451 of the second through hole 45 via the bonding material 14. In this way, by arranging the first through hole 26 and the second through hole 45 so as to not be superimposed to each other in plan view, it is possible to ensure the hermeticity of the internal space 13 in which the vibrating part 22 of the crystal resonator plate 2 is hermetically sealed without the necessity of filling the through part 262 of the first through hole 26 and the through part 452 of the second through hole 45 with a metal and the like.

In the package 12 produced as described above, the first sealing member 3 and the crystal resonator plate 2 have a gap of not more than 1.00 μm. The second sealing member 4 and the crystal resonator plate 2 have a gap of not more than 1.00 μm. That is, the thickness of the bonding material 11 between the first sealing member 3 and the crystal resonator plate 2 is not more than 1.00 μm, and the thickness of the bonding material 11 between the second sealing member 4 and the crystal resonator plate 2 is not more than 1.00 μm (specifically, the thickness in the Au—Au bonding of this embodiment is 0.15 to 1.00 μm). As a comparative example, the conventional metal paste sealing material containing Sn has a thickness of 5 to 20 μm.

Figure 8:
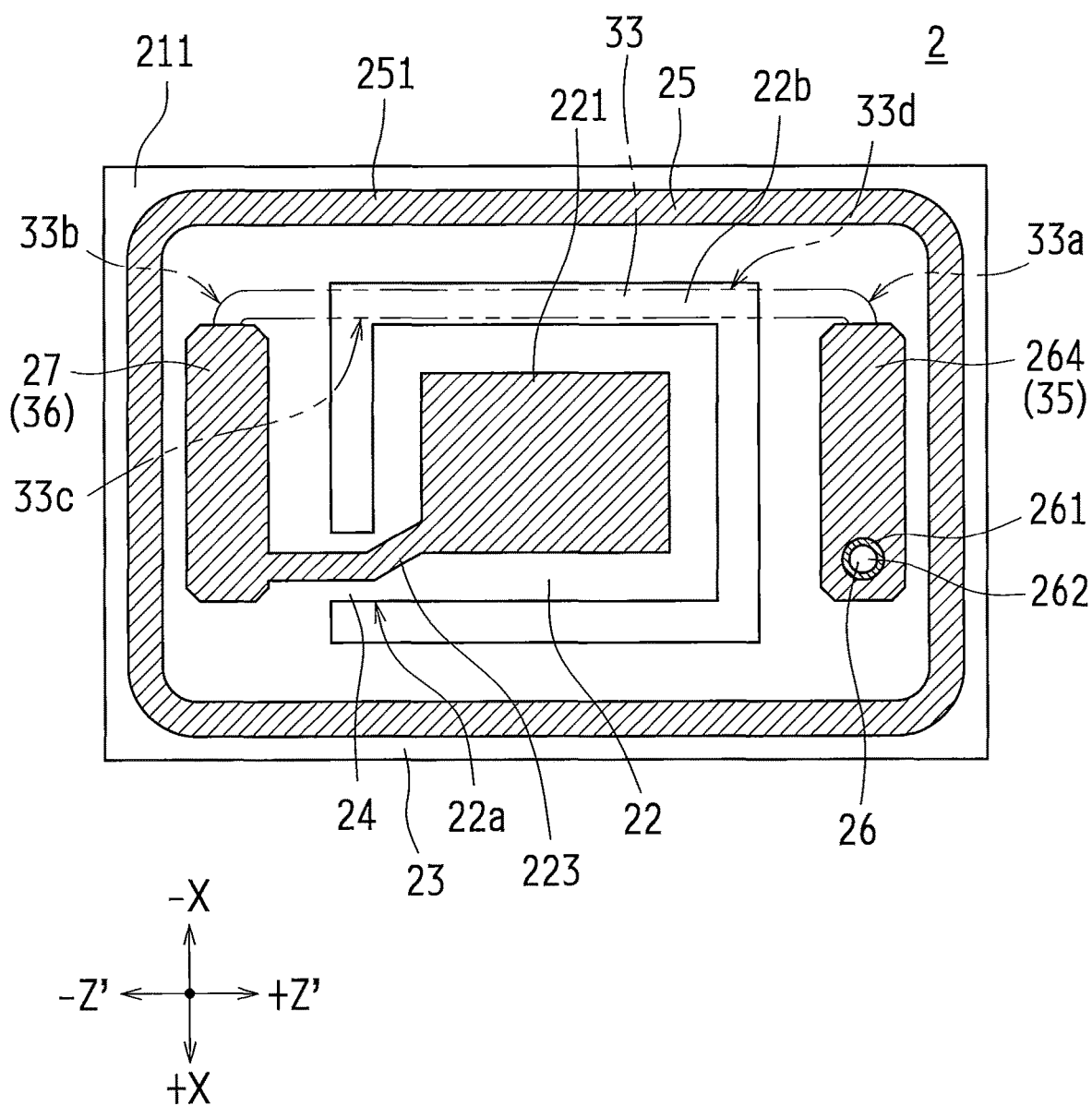
FIG. 8 is a diagram illustrating a positional relationship in plan view between a wiring of the first sealing member and a vibrating part of the crystal resonator plate in the crystal resonator.

In the crystal resonator 101 having the sandwich structure of this embodiment, the wiring pattern 33, which is connected to the first excitation electrode 221 of the crystal resonator plate 2, is provided on the second main surface 312 of the first sealing member 3, i.e. on the surface facing the crystal resonator plate 2. At least part of the wiring pattern 33 is superimposed to the space between the vibrating part 22 and the external frame part 23 in plan view. Now, the specific configuration of the wiring pattern 33 is described with reference to FIGS. 4 and 8. FIG. 8 is a diagram illustrating the positional relationship in plan view between the wiring pattern 33 of the first sealing member 3 and the vibrating part 22 of the crystal resonator plate 2 in the crystal resonator 101. In FIG. 8, the crystal resonator plate 2 in FIG. 4 is shown by the solid line while the wiring pattern 33 of the first sealing member 3 is shown by the dashed double-dotted line.

Before the crystal resonator plate 2 is bonded to the first sealing member 3, the wiring pattern 33 is disposed between the connecting bonding patterns 35 and 36 on the second main surface 312 of the first sealing member 3 (see FIG. 3). A first end part (an end part in the +Z' direction in FIG. 8) 33a of the wiring pattern 33 is connected to the connecting bonding pattern 35, and a second end part (an end part in the −Z' direction in FIG. 8) 33b of the wiring pattern 33 is connected to the connecting bonding pattern 36.

Then, by bonding the crystal resonator plate 2 to the first sealing member 3, the connecting bonding patterns 264 and 35 become the bonding material 14. Also, the connecting bonding patterns 27 and 36 become the bonding material 14. However, since the wiring pattern 33 is bonded to neither the connecting bonding pattern 264 nor the connecting bonding pattern 27 of the crystal resonator plate 2, it does not become the bonding material 14. Thus, the wiring pattern 33 remains on the second main surface 312 of the first sealing member 3 as the wiring. The first end part 33a of the wiring pattern 33 is connected to the first external electrode terminal 431 via the bonding material 14 (the connecting bonding patterns 264 and 35), the through electrode 261 of the first through hole 26, the bonding material 14 (the connecting bonding patterns 265 and 453), and the through electrode 451 of the second through hole 45. The second end part 33b of the wiring pattern 33 is connected to the first excitation electrode 221 via the bonding material 14 (the connecting bonding patterns 27 and 36) and the first extraction electrode 223. In this way, the first excitation electrode 221 is electrically connected to the first external electrode terminal 431 via the wiring pattern 33.

The wiring pattern 33 is disposed so as to not be superimposed to the first excitation electrode 221 and the second excitation electrode 222 in plan view. Specifically, as shown in FIG. 8, the wiring pattern 33 is disposed so as to not be superimposed to the vibrating part 22 in plan view. In this embodiment, a side edge part 33c of the wiring pattern 33, which is on the side closer to the vibrating part 22 (i.e. an edge in +X direction in FIG. 8), is disposed so as to be superimposed to the space between the vibrating part 22 and the external frame part 23 in plan view. That is, a predetermined interval is disposed, in plan view, between the side edge part 33c of the wiring pattern 33 on the side closer to the vibrating part 22 and the outer peripheral edge of the vibrating part 22. Also, a side edge part 33d of the wiring pattern 33, which is on the side farther from the vibrating part 22 (i.e. an edge in −X direction in FIG. 8), is disposed so as to be superimposed to the space between the vibrating part 22 and the external frame part 23 in plan view, but to not be superimposed to the external frame part 23 in plan view. That is, a predetermined interval is disposed, in plan view, between the side edge part 33d of the wiring pattern 33 on the side farther from the vibrating part 22 and the inner peripheral edge of the external frame part 23. Thus, in this embodiment, both side edge parts 33c and 33d of the wiring pattern 33 in the X axis direction are included in the space between the vibrating part 22 and the external frame part 23 in plan view. The first end part 33a and the second end part 33b (i.e. the parts that protrude to the outside of the above space in the Z axis direction) of the wiring pattern 33 are superimposed to the external frame part 23 in plan view.

According to this embodiment, the wiring pattern 33 provided on the second main surface 312 of the first sealing member 3 has the above-described positional relationship with the vibrating part 22 of the crystal resonator plate 2. Thus, it is possible to effectively use the second main surface 312 of the first sealing member 3 as the region in which the wiring pattern 33 is disposed, which leads to downsizing of the crystal resonator 101 while maintaining the size of the vibrating part 22. In other words, it is not necessary to separately prepare, on the crystal resonator plate 2, the region in which the wiring pattern 33 is disposed, which allows increase in the size of the vibrating part 22. As a result, it is not necessary to reduce the size of the vibrating part 22 too much in order to meet the requirement to reduce the size of the crystal resonator 101.

In this embodiment, the crystal resonator plate 2 has a configuration in which the vibrating part 22 and the external frame part 23 are connected to each other via the single connecting part 24. In this case, the first extraction electrode 223 and the second extraction electrode 224, which are respectively drawn from the first excitation electrode 221 and the second excitation electrode 222 on both main surfaces of the vibrating part 22, are formed so as to extend to the external frame part 23 via the same connecting part 24.

That is, the first extraction electrode 223 that is drawn from the first excitation electrode 221 is formed on the first main surface of the connecting part 24, and the second extraction electrode 224 that is drawn from the second excitation electrode 222 is formed on the second main surface of the connecting part 24.

Thus, the crystal resonator plate 2 includes only one connecting part 24, and the first extraction electrode 223 and the second extraction electrode 224 are drawn in the same direction from the first excitation electrode 221 and the second excitation electrode 222. On the other hand, the external electrode terminals (the first external electrode terminal 431 and the second external electrode terminal 432) are located at respective end parts of the second main surface 412 of the second sealing member 4 in the longitudinal direction. Therefore, it is necessary to provide a routing electrode so as to extend either the first extraction electrode 223 or the second extraction electrode 224 to the opposite position with the vibrating part 22 being interposed. However, if the routing electrode is formed on the crystal resonator plate 2, it is necessary to provide the routing electrode on the outer periphery of the vibrating part 22 (i.e. the external frame part 23) of the crystal resonator plate 2. Accordingly, in order to ensure the region in which the routing electrode is disposed, the size of the vibrating part 22 should be reduced or the package size of the crystal resonator 101 should be increased. Thus, it is difficult to downsize the crystal resonator 101 without reducing the size of the vibrating part 22.

However, in this embodiment, the wiring pattern 33 as the above-described routing electrode is formed not on the crystal resonator plate 2 but on the second main surface 312 of the first sealing member 3. For this reason, it is possible to effectively use the second main surface 312 of the first sealing member 3 as the region in which the wiring pattern 33 is disposed, which leads to downsizing of the crystal resonator 101 while maintaining the size of the vibrating part 22. As the region in which the wiring pattern 33 is disposed, the wiring pattern 33 is provided at a position where the wiring pattern 33 is not superimposed to the first excitation electrode 221 and the second excitation electrode 222 in plan view, and where at least part of the wiring pattern 33 is superimposed to the space between the vibrating part 22 and the external frame part 23 in plan view. In this way, it is possible to reduce the region as the sum of the arrangement area of the vibrating part 22 and the wiring pattern 33 in plan view compared to the configuration in which the routing electrode is provided on the outer periphery (the external frame part 23) of the vibrating part 22 of the crystal resonator plate 2. Therefore, it is possible to downsize the crystal resonator 101 without reducing the size of the vibrating part 22. Furthermore, since it is possible to prevent reduction of the region for bonding the external frame part 23 of the crystal resonator plate 2 to the respective sealing members 3 and 4, the bonding region can be ensured so as to realize more stable sealing hermeticity.

Also, since the wiring pattern 33 is arranged inside the bonding material 11 in plan view, it is possible to prevent the wiring pattern 33 from being disconnected. In this case, since the wiring pattern 33 is disposed so as to not be superimposed to the vibrating part 22 in plan view, it is possible to prevent the wiring pattern 33 and the vibrating part 22 from making contact with each other. Thus, it is possible to reduce disconnection, or increase in the resistance value, of the wiring pattern 33 caused by the contact of the wiring pattern 33 with the vibrating part 22. Furthermore, since the wiring pattern 33 is disposed so as to not be superimposed to the first excitation electrode 221 and the second excitation electrode 222 in plan view, it is possible to reduce generation of the parasitic capacity (stray capacity) due to the wiring pattern 33 that is superimposed to the first excitation electrode 221 and the second excitation electrode 222.

Also, since the second main surface 312 of the first sealing member 3 is formed as a flat surface, the thickness of the first sealing member 3 can be reduced, which contributes to reduction in height of the crystal resonator 101. That is, if a recess part is disposed in the second main surface 312 of the first sealing member 3, the thickness of the first sealing member 3 may be increased by the depth of the recess part. However, by forming the second main surface 312 of the first sealing member 3 as a flat surface, it is possible to prevent the thickness of the first sealing member 3 from being increased. Thus, it is possible to improve reduction in height of the crystal resonator 101. In this case, the vibrating part 22 and the connecting part 24 of the crystal resonator plate 2 are made thinner than the external frame part 23, which is beneficial for prevention of the contact of the vibrating part 22 with the first sealing member 3 and the second sealing member 4 while reducing the height of the crystal resonator 101.

Here, it is preferable that the wiring pattern 33 is disposed outside the region of the excitation electrodes (the first excitation electrode 221 and the second excitation electrode 222) irradiated with ion beams for adjusting the frequency. In this embodiment, in order to adjust the frequency, the second excitation electrode 222 is irradiated with the ion beams from the side of the second main surface 212 of the crystal resonator plate 2 in the state in which the crystal resonator plate 2 is bonded to the first sealing member 3 (and furthermore the crystal resonator plate 2 is not bonded to the second sealing member 4) so that the largeness (mass) of the second excitation electrode 222 is finely adjusted. The area in the vicinity of the outer periphery of the second excitation electrode 222 is irradiated with the ion beams as the target area. At this time, if the wiring pattern 33 is disposed within the region irradiated with the ion beams, the wiring pattern 33 may also be cut by the ion beams, which may result in disconnection of the wiring pattern 33. However, by disposing the wiring pattern 33 outside the region of the excitation electrodes irradiated with the ion beams for adjusting the frequency, it is possible to prevent the wiring pattern 33 from being disconnected by the ion beams. When such a frequency adjustment is performed, an inspection terminal for frequency adjustment is provided on the first main surface 311 of the first sealing member 3 so that the inspection terminal is connected to the first excitation electrode 221 and the second excitation electrode 222.

In this embodiment, the side edge part 33*d* of the wiring pattern 33, which is on the side farther from the vibrating part 22, is disposed so as to not be superimposed to the external frame part 23 in plan view. However, it is sufficient to dispose at least part of the wiring pattern 33 so as to be superimposed to the space between the vibrating part 22 and the external frame part 23 in plan view, accordingly, the wiring pattern 33 may be disposed so that part of the wiring pattern 33 is superimposed to the external frame part 23 in plan view. In contrast, for the reason as described above, it is preferable that the side edge part 33*c* of the wiring pattern 33, which is on the side closer to the vibrating part 22, is disposed so as to not be superimposed to the vibrating part 22 in plan view.

Embodiment 2

In the crystal resonator 101 according to Embodiment 2, the wiring width and the film thickness of the wiring pattern 33 in Embodiment 1 is optimized from another viewpoint compared to Embodiment 1. Thus, the configuration other than the above is basically the same as the configuration in Embodiment 1. Therefore, a detailed description of the same configuration as that of the Embodiment 1 is omitted.

As described in Embodiment 1, in the crystal resonator 101 to which the present invention is applied, the connecting part 24 that connects the vibrating part 22 to the external frame part 23 is provided at only one position on the crystal resonator plate 2. That is, the connecting part 24 is provided on only one side in the long side direction (Z' axis) of the crystal resonator plate 2 relative to the vibrating part 22 (i.e. it is provided in the −Z' direction). Thus, the first extraction electrode 223 and the second extraction electrode 224, which are respectively drawn from the first excitation electrode 221 and the second excitation electrode 222 on both main surfaces of the vibrating part 22, are formed so as to extend to the external frame part 23 via the same connecting part 24.

Thus, the crystal resonator plate 2 includes only one connecting part 24, and the first extraction electrode 223 and the second extraction electrode 224 are drawn in the same direction from the first excitation electrode 221 and the second excitation electrode 222. On the other hand, the external electrode terminals (the first external electrode terminal 431 and the second external electrode terminal 432) are located at respective end parts of the second main surface 412 of the second sealing member 4 in the longitudinal direction. Therefore, it is necessary to provide a routing electrode so as to extend either the first extraction electrode 223 or the second extraction electrode 224 to the opposite position with the vibrating part 22 being interposed. Thus, the wiring pattern 33 is formed as the routing electrode. The wiring pattern 33 is formed as part of the wiring to connect the first excitation electrode 221 to the first external electrode terminal 431.

The routing of the electrode as described above results in elongation of the wiring route to connect the first excitation electrode 221 to the first external electrode terminal 431, which is accompanied with increase in the wiring resistance. Thus, the increased wiring resistance on the first excitation electrode 221 side due to the wiring pattern 33 cannot be ignored compared to the series resistance on the second excitation electrode 222 side that does not have the wiring pattern 33 for routing.

If the wiring resistance of the signal wiring that connects the excitation electrode to the external electrode terminal increases, the reliability of an oscillation circuit including the crystal resonator may be degraded. For this reason, it is preferable for the crystal resonator 101 to reduce the wiring resistance of the wiring pattern 33 so that the reliability of the oscillation circuit including the crystal resonator 101 can be maintained.

Figure 9:
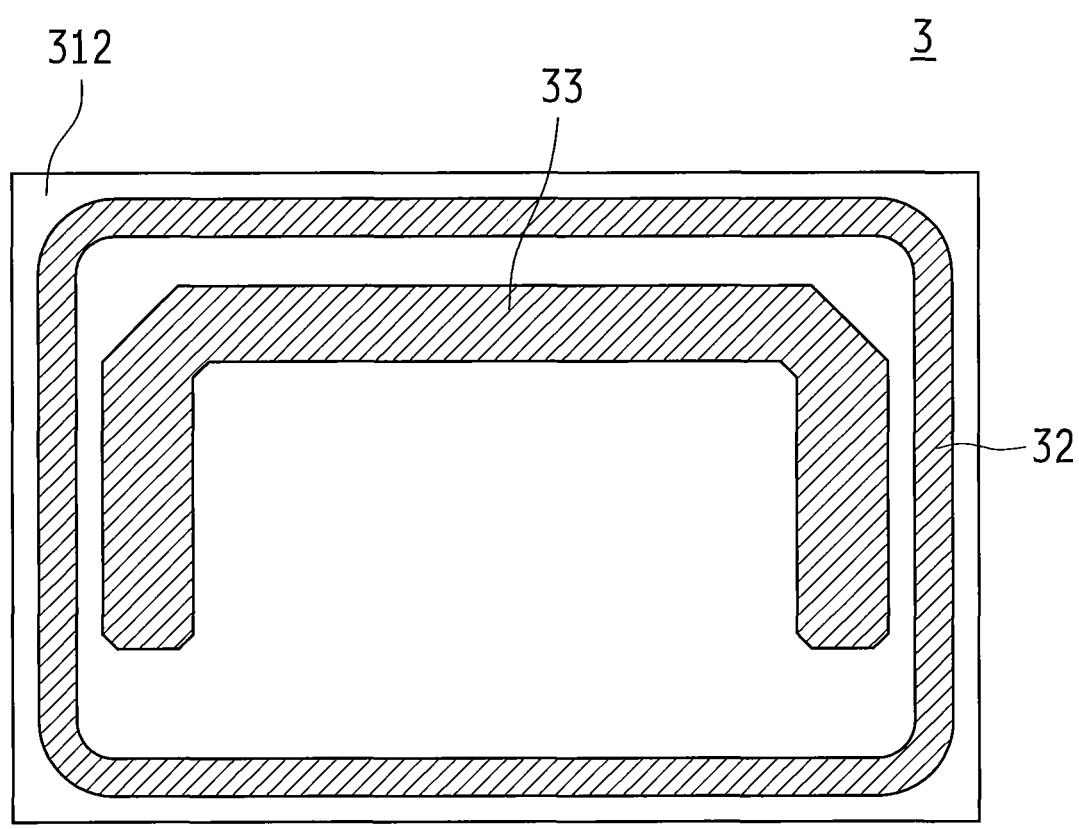
FIG. 9 is a schematic rear view illustrating the first sealing member of the crystal resonator.
Figure 9:
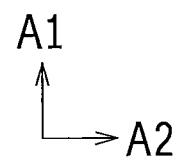
Figure 10:
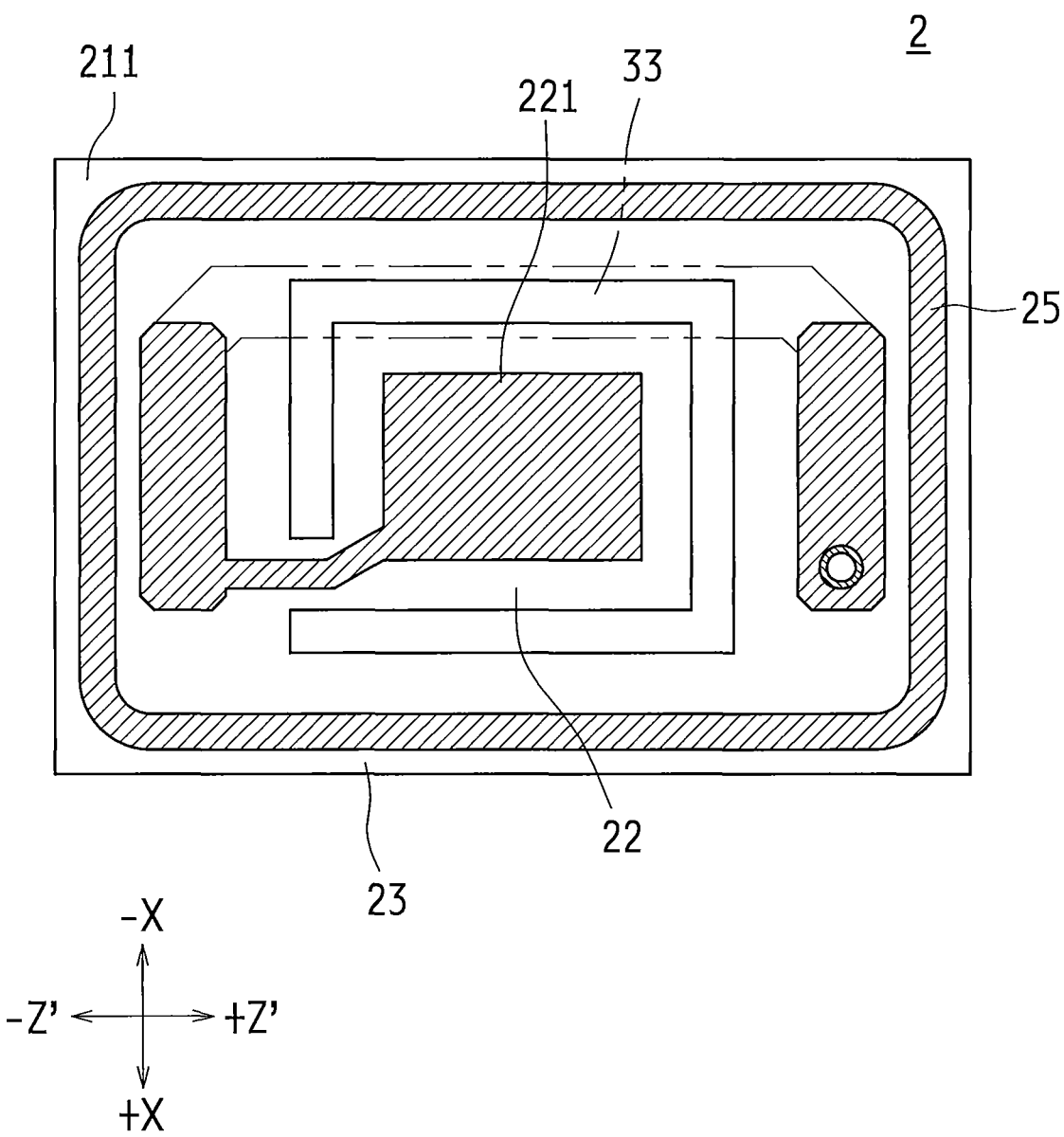
FIG. 10 is a diagram illustrating a positional relationship in plan view between the wiring of the first sealing member and the vibrating part of the crystal resonator plate in the crystal resonator.

In order to reduce the wiring resistance of the wiring pattern 33, increasing the wiring width, or increasing the film thickness of the wiring may be considered. FIGS. 9 and 10 are diagrams illustrating the configuration in which the wiring pattern 33 is thickened compared to the wiring pattern in FIGS. 3 and 8. FIG. 9 is a schematic rear view illustrating the first sealing member of the crystal resonator. FIG. 10 is a diagram illustrating a positional relationship in plan view between the wiring pattern 33 of the first sealing member 3 and the vibrating part 22 of the crystal resonator plate 2 in the crystal resonator 101. In FIG. 10, the crystal resonator plate 2 is shown by the solid line while the wiring pattern 33 of the first sealing member 3 is shown by the dashed double-dotted line.

In the configuration shown in FIGS. 9 and 10, the wiring width of the wiring pattern 33 is thickened. Thus, the wiring pattern 33 is disposed so as to completely cover the space along one side (an upper side in FIG. 10) of the vibrating part 22 in plan view in the space between the vibrating part 22 and the external frame part 23. Also, when the wiring width of the wiring pattern 33 is thickened, the wiring pattern 33 is preferably disposed so as to not be superimposed to the first excitation electrode 221 and the second excitation electrode 222 in plan view, similarly to Embodiment 1. This is to reduce generation of the parasitic capacity (stray capacity) due to the wiring pattern 33 that is superimposed to the first excitation electrode 221 and the second excitation electrode 222.

Thus, in order to meet the precondition that the wiring pattern 33 is not superimposed to the first excitation electrode 221 and the second excitation electrode 222, there is a limit to the thickness of the wiring width of the wiring pattern 33. That is, thickening the wiring width of the wiring pattern 33 makes it difficult to reduce the size of the crystal resonator 101. When the package has the size of, for example, 1.0×0.8 mm, the wiring width of the wiring pattern 33 is preferably within the distance between the first excitation electrode 221, and the sealing-member-side first sealing part 32 and the resonator-plate-side sealing part 25 (approximately 200 μm), and within the distance between the second excitation electrode 222, and the sealing-member-side second sealing part 42 and the resonator-plate-side sealing part 25 (approximately 200 μm). Furthermore, the wiring width is preferably not less than 100 μm.

On the other hand, thickening the film thickness of the wiring pattern 33 can easily reduce the wiring resistance of the wiring pattern 33 without upsizing of the crystal resonator 101. Hereinafter, the preferable range of the film thickness of the wiring pattern 33 is described.

Figure 11:
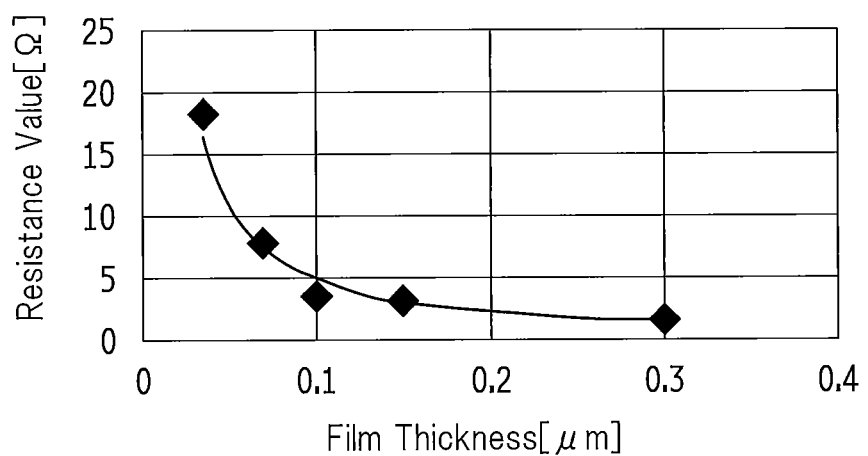
FIG. 11 is a graph indicating a relationship between a film thickness and a resistance value of the wiring.

FIG. 11 is a graph indicating a relationship between the film thickness and a resistance value of the wiring. Here, the wiring width is about 0.040 mm, and the wiring length is about 1 mm. The wiring structure of the wiring pattern 33 is a laminated structure of the Ti layer and Au layer, as described in Embodiment 1. In such a wiring having the Ti—Au laminated structure, the electrical resistance of only the Ti layer can be ignored, because it is sufficiently larger than the electrical resistance of the Au layer. Therefore, FIG. 11 indicates the results when the film thickness of the Au wiring is changed.

As can be seen from FIG. 11, in the range where the film thickness is less than 0.1 μm, the resistance value of the wiring radically decreases as the film thickness increases. In the range where the film thickness is not less than 0.1 μm, the resistance value of the wiring also decreases as the film thickness increases, however, it changes more gradually.

In order to maintain the reliability of the crystal resonator 101, it is preferable to reduce, as much as possible, the wiring resistance of the signal wiring that connects the excitation electrode to the external electrode terminal. As described above, in the wiring route that connects the first excitation electrode 221 to the first external electrode terminal 431, when the wiring resistance of the signal wiring that connects the excitation electrode to the external electrode terminal increases due to the wiring resistance of the wiring pattern 33, the reliability of the oscillation circuit including the crystal resonator is degraded. For this reason, in order to prevent the wiring resistance from increasing due to the wiring pattern 33, the target value here of the wiring resistance of the wiring pattern 33 is set to not more than 10Ω.

In the results indicated in FIG. 11, the wiring resistance when the film thickness is 0.05 μm is approximately 10Ω. Therefore, it is preferable that the film thickness of the wiring pattern 33 is set to not less than 0.05 μm. Also, as described above, in the range where the film thickness is less than 0.1 μm, the resistance value of the wiring radically decreases as the film thickness increases. Thus, it is further preferable that the film thickness of the wiring pattern 33 is set to not less than 0.1 μm. In the graph indicated in FIG. 11, the wiring width is about 0.040 mm, and the wiring length is about 1 mm. However, when the package size of the crystal resonator 101 is changed, the increase rate of the resistance value due to increase in the wiring length and the decrease rate of the resistance value due to increase in the wiring width cancel each other out to some extent. For this reason, even when the package size of the crystal resonator 101 is changed, the graph in FIG. 11 has a tendency to indicate similar results. For example, the similar tendency as described below could be seen regardless of the package size of the crystal resonator 101: the tendency that the change in the wiring resistance is radical in the range where the film thickness is less than 0.1 μm and that the change is gradual in the range where the film thickness is not less than 0.1 μm.

From the viewpoint of decreasing the wiring resistance of the wiring pattern 33, the larger film thickness of the wiring pattern 33 is preferable. However, when increasing the film thickness of the wiring pattern 33 (the film thickness of the Au layer), the used amount of Au increases, which results in cost increase. Also, as described above, when the wiring pattern 33 and the sealing-member-side first sealing part 32 are formed at the same time, and when the Au—Au diffusion bonding is performed so as to bond the first sealing member 3 to the crystal resonator plate 2, increase in the film thickness of the Au layer leads to increase in surface roughness of the Au layer. Thus, the Au—Au diffusion bonding becomes difficult to perform. In consideration of the above, the film thickness of the wiring pattern 33 is preferably not more than 0.7 μm, and further preferably not more than 0.3 μm.

In Embodiments 1 and 2, the first sealing member 3 and the second sealing member 4 are made of glass, however, the present invention is not limited thereto. They may be made of crystal.

In Embodiments 1 and 2, the piezoelectric resonator plate is made of crystal, however, the present invention is not limited thereto. It may be made of any other material provided that it is a piezoelectric material (e.g. lithium niobate and lithium tantalite).

In Embodiments 1 and 2, the first sealing member 3 is bonded to the crystal resonator plate 2, and the crystal resonator plate 2 is bonded to the second sealing member 4, respectively by the Au—Au diffusion bonding. However, the present invention is not limited thereto. They may be bonded using a brazing material.

In the above Embodiments, the crystal resonator is used for the piezoelectric resonator device. However, the present invention is not limited thereto. The present invention may be applied to a piezoelectric resonator device other than the crystal resonator (e.g. crystal oscillator).

INDUSTRIAL APPLICABILITY

The present invention is suitable for a crystal resonator device (such as a crystal resonator and a crystal oscillator) in which crystal is used as a material of a substrate of a piezoelectric resonator plate.

DESCRIPTION OF REFERENCE NUMERALS

101 Crystal resonator
12 Package
13 Internal space
2 Crystal resonator plate
22 Vibrating part
221 First excitation electrode
222 Second excitation electrode
223 First extraction electrode
224 Second extraction electrode
23 External frame part
24 Connecting part
3 First sealing member
312 Second main surface
33 Wiring pattern (wiring)
4 Second sealing member

The invention claimed is:

1. A piezoelectric resonator device, comprising:
a piezoelectric resonator plate including a first excitation electrode formed on a first main surface of a substrate, and a second excitation electrode formed on a second main surface of the substrate, the second excitation electrode making a pair with the first excitation electrode;
a first sealing member covering the first excitation electrode of the piezoelectric resonator plate;
a second sealing member covering the second excitation electrode of the piezoelectric resonator plate; and
an internal space formed by bonding the first sealing member to the piezoelectric resonator plate and by bonding the second sealing member to the piezoelectric resonator plate, the internal space hermetically sealing a vibrating part including the first excitation electrode and the second excitation electrode of the piezoelectric resonator plate, wherein the piezoelectric resonator plate further includes:
the vibrating part formed so as to have a substantially rectangular shape;
an external frame part surrounding an outer periphery of the vibrating part; and
a connecting part connecting the vibrating part to the external frame part, wherein the vibrating part, the connecting part and the external frame part are formed integrally with one another, wherein a first extraction electrode, which is drawn from the first excitation electrode, is formed on a first main surface of the connecting part while a second extraction electrode, which is drawn from the second excitation electrode, is formed on a second main surface of the connecting part, wherein a wiring that is connected to the first extraction electrode is formed on a surface of the first sealing member facing the piezoelectric resonator plate,
wherein at least part of the wiring is disposed so as to be superimposed to a space between the vibrating part and the external frame part in plan view and
wherein the wiring is disposed so as to not be superimposed to the first excitation electrode and the second excitation electrode in plan view.

2. The piezoelectric resonator device according to claim 1, wherein
the wiring is disposed so as to completely cover the space along one side of the vibrating part in plan view.

3. The piezoelectric resonator device according to claim 1, wherein
the wiring has a film thickness of not less than 0.05 um.

4. The piezoelectric resonator device according to claim 1, wherein
the wiring is disposed outside a region irradiated with ion beams for adjusting the frequency of the first excitation electrode and the second excitation electrode in plan view.

5. The piezoelectric resonator device according to claim 1, wherein
the surface of the first sealing member facing the piezoelectric resonator plate is formed as a flat surface.

6. The piezoelectric resonator device according to claim 1, wherein
the connecting part extends from only one corner part of the vibrating part to the external frame part.

* * * * *